(12) United States Patent
Heaston

(10) Patent No.: US 7,049,876 B2
(45) Date of Patent: May 23, 2006

(54) LEVEL SHIFT CIRCUITS AND RELATED METHODS

(75) Inventor: Bruce A. Heaston, West Milton, OH (US)

(73) Assignee: Delphi Technologies, Inc., Troy, MI (US)

( * ) Notice: Subject to any disclaimer, the term of this patent is extended or adjusted under 35 U.S.C. 154(b) by 19 days.

(21) Appl. No.: 10/973,018

(22) Filed: Oct. 25, 2004

(65) Prior Publication Data

US 2006/0087358 A1    Apr. 27, 2006

(51) Int. Cl.
H03L 5/00 (2006.01)

(52) U.S. Cl. .......................... 327/333; 326/80; 326/81

(58) Field of Classification Search ................ 327/333; 326/62, 63, 64, 65, 66, 67, 68, 69, 70, 71, 326/72, 73, 74, 80, 81
See application file for complete search history.

(56) References Cited

U.S. PATENT DOCUMENTS

| | | | |
|---|---|---|---|
| 3,851,190 A | 11/1974 | Hongu et al. ............... 327/333 |
| 4,723,112 A | 2/1988 | Diller et al. ................ 330/258 |
| 5,936,433 A | 8/1999 | Holloway ...................... 327/75 |
| 6,018,261 A | 1/2000 | Alford et al. ................ 327/307 |
| 6,222,385 B1 | 4/2001 | Kang ........................... 326/68 |
| 6,222,386 B1 | 4/2001 | Alford et al. ................. 326/80 |
| 6,236,243 B1 | 5/2001 | Takeshima .................... 327/88 |
| 6,384,620 B1 * | 5/2002 | Yamada et al. ................ 326/29 |
| 6,433,611 B1 | 8/2002 | Foroudi et al. .............. 327/333 |

FOREIGN PATENT DOCUMENTS

| | | |
|---|---|---|
| JP | 4179311 | 6/1992 |
| JP | 10341148 | 12/1998 |
| JP | 10341149 | 12/1998 |
| JP | 11274907 | 10/1999 |
| JP | 2000224024 | 8/2000 |
| JP | 2002100978 | 4/2002 |
| WO | WO 96/10865 | 4/1996 |

* cited by examiner

Primary Examiner—Kenneth B. Wells
Assistant Examiner—Khareem E. Almo
(74) Attorney, Agent, or Firm—Michael D. Smith

(57) ABSTRACT

A level shifting circuit functions by taking an input signal, producing a complement of the input signal, applying the input signal and its complement to comparable voltage divider pairs to set up a differential input signal that is applied to a comparator that produces a shifted output signal.

14 Claims, 3 Drawing Sheets

US 7,049,876 B2

LEVEL SHIFT CIRCUITS AND RELATED METHODS

TECHNICAL FIELD

The present application relates generally to circuits used for level shifting, and more particularly to level shifting circuits in which an input signal is level shifted by creating a complement of the input signal and applying both the input signal and its complement to voltage dividers.

BACKGROUND OF THE INVENTION

Conventional level shifting circuits for shifting a logic signal from a ground referenced positive logic supply to a negative referenced supply using discrete components can exhibit performance and cost limitations, including component cost, component count, asymmetrical propagation delays, noise sensitivity and power supply sensitivity. Conventional level shifting circuits for shifting a logic signal from a ground based positive logic supply to a higher voltage positive supply can exhibit similar performance and cost limitations.

It would be desirable to provide level shifting circuits that, in some applications, offer high speed, lower cost, lower component count and a wide operating range for the shifted reference supply voltage.

SUMMARY OF THE INVENTION

In one aspect, a level shifting circuit functions by taking a ground referenced positive logic level input signal, producing a complement of the input signal, applying the input signal and its complement to comparable voltage divider pairs to set up a differential input signal that is applied to a comparator that produces a shifted output signal. In one implementation the circuit operates as a bipolar level shift circuit and each of the voltage divider pairs is referenced to a negative supply. In another implementation the circuit operates as a positive level shift circuit and each of the voltage divider pairs is referenced to a positive supply.

DESCRIPTION OF THE PREFERRED EMBODIMENT

Figure 1:
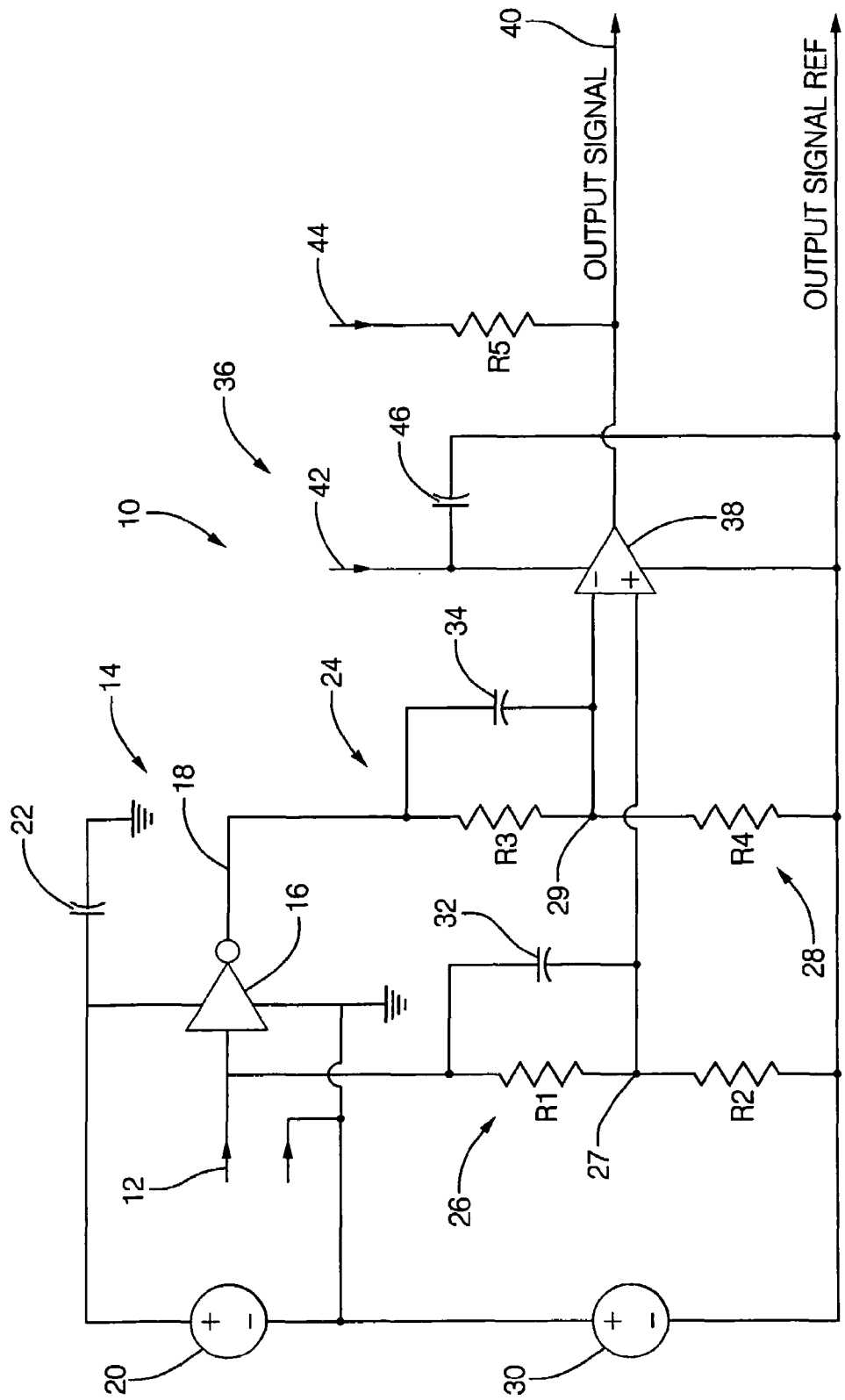
FIG. 1 is a schematic of a bipolar level shift circuit.

Referring now to the drawings, FIG. 1 shows an embodiment of a bipolar level shift circuit 10, which circuit is useful for shifting a ground referenced positive logic level signal to an output signal referenced to a negative supply. Input 12 is provided for receiving the ground referenced positive logic level signal. An inverting circuit portion 14 includes an inverter 16 connected to receive the ground referenced positive logic level signal and to produce a complement logic signal at output 18 (e.g, an input 5 volt logic high signal is inverted to a 0 volt logic low signal, an input 0 volt logic low signal is inverted to a logic high signal of a voltage corresponding to power supply 20). Inverter 16 is powered by voltage supply 20, with capacitor 22 provided for voltage stability.

Voltage divider circuitry 24 includes a voltage divider 26 formed by resistors R1 and R2 and a voltage divider 28 formed by resistors R3 and R4. Both the ground referenced positive logic level signal and the complement logic signal are applied to the respective voltage dividers 26 and 28. Both voltage dividers 26 and 28 are referenced to the negative side of a voltage supply 30. A differential signal is produced in the form of a voltage divided signal at the junction 27 of R1 and R2 and a voltage divided signal at the junction 29 of R3 and R4. The voltage divided signal at junction 27 is established based upon the combination of negative supply 30 and the ground referenced positive logic level signal, and the voltage divided signal at junction 29 is established based upon the combination of negative supply 30 and the complement logic signal. The resistors of the voltage divider 26 and the voltage divider 28 are sized to provide the same voltage division ration (i.e., $R1/R2=R3/R4$). Capacitors 32 and 34 are connected across resistors R1 and R3 respectively and aid in compensating for parasitic and comparator input capacitances.

Comparator circuitry 36 includes a comparator 38 having a negative input to which the voltage divided signal of junction 29 is applied and a positive input to which the voltage divided signal at junction 27 is applied. The comparator circuitry produces an output signal (OUTPUT SIGNAL) at output line 40, which output signal is referenced to the negative side of voltage supply 30. The output signal is set higher or lower based upon a difference between the voltage divided signal at junction 27 and the voltage divided signal at junction 29 (e.g., which signal is higher in voltage). By way of example, in the case of an open collector comparator 38, output signal line input 44 may be connected to a voltage supply that is higher in voltage than negative supply 30. When the voltage divided signal at junction 27 is less than the voltage divided signal at junction 29, the comparator connects the OUTPUT SIGNAL line 40 to the negative supply 30 (the output voltage swings low). By contrast, when the voltage divided signal at junction 27 is higher than the voltage divided signal at junction 29, the comparator breaks the connection of the OUTPUT SIGNAL line 40 to the negative supply 30, and the OUTPUT SIGNAL line 40 is pulled higher through resistor R5 to the voltage supply that is applied at input 44 (the output voltage swings high). Supply input 42 of comparator and output line supply input 44 can be connected to separate supplies referenced to the output signal reference (OUTPUT SIGNAL REF), ground or the voltage supply 20 depending on the desired characteristics of the comparator output. Capacitor 46 provides voltage stability for supply input 42.

Figure 2:
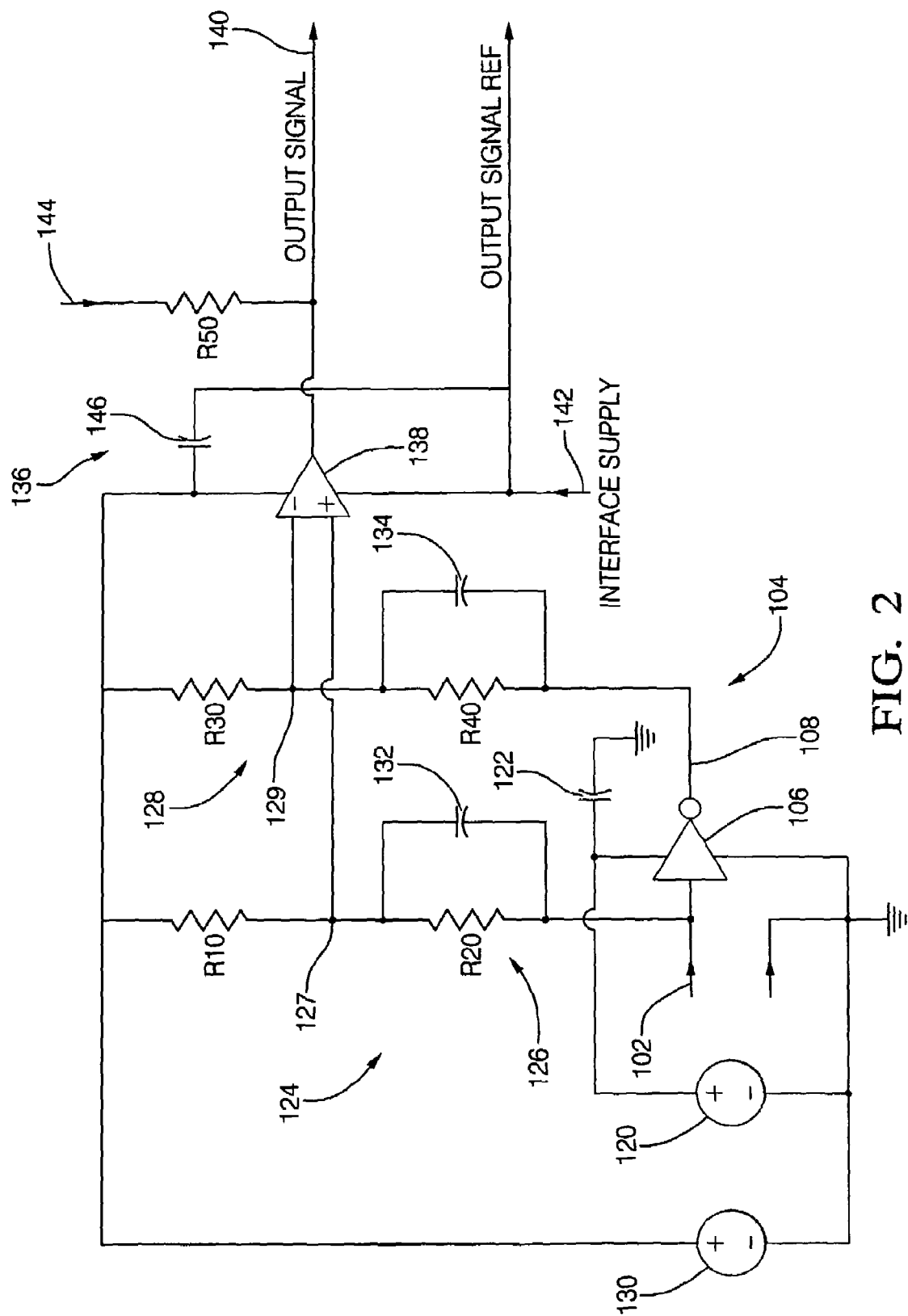
FIG. 2 is a schematic of a positive level shift circuit.

Referring now to FIG. 2, a positive level shift circuit 100 useful for shifting a ground referenced positive logic level signal to an output signal referenced to a higher positive supply is shown. Input 102 is provided for receiving the ground referenced positive logic level signal. An inverting circuit portion 104 includes an inverter 106 connected to receive the ground referenced positive logic level signal and to produce a complement logic signal at output 108 (e.g, an input 5 volt logic high signal is inverted to a 0 volt logic low signal, an input 0 volt logic low signal is inverted to a logic high signal of a voltage corresponding to power supply 120). Inverter 106 is powered by voltage supply 120 with capacitor 122 provided for voltage stability.

Voltage divider circuitry 124 includes a voltage divider 126 formed by resistors R10 and R20 and a voltage divider 128 formed by resistors R30 and R40. Both the ground referenced positive logic level signal and the complement logic signal are applied to the respective voltage dividers 126 and 128. Both voltage dividers 126 and 128 are referenced to the positive side of a voltage supply 130. A differential signal is produced in the form of a voltage divided signal at the junction 127 of R10 and R20 and a voltage divided signal at the junction 129 of R30 and R40. The voltage divided signal at junction 127 is established based upon the combination of positive supply 130 and the ground referenced positive logic level signal, and the voltage divided signal at junction 129 is established based upon the combination of the positive supply 130 and the complement logic signal. The resistors of the voltage divider 126 and the voltage divider 128 are sized to provide the same voltage division ration (i.e., $R10/R20=R30/R40$). Capacitors 132 and 134 are connected across resistors R20 and R40 respectively and aid in compensating for parasitic and comparator input capacitances.

Comparator circuitry 136 includes a comparator 138 having a negative input to which the voltage divided signal of junction 129 is applied and a positive input to which the voltage divided signal at junction 127 is applied. The comparator circuitry produces an output signal (OUTPUT SIGNAL) at output line 140, which output signal is referenced to the INTERFACE SUPPLY at input 142, which connects to comparator 138. The output signal is set higher or lower based upon a difference between the voltage divided signal at junction 127 and the voltage divided signal at junction 129. By way of example, in the case of an open collector comparator 138, output signal line input 144 may be connected to a voltage supply that is higher in voltage than the voltage of the interface supply input 142. The output signal corresponds to a difference between the voltage divided signal at junction 127 and the voltage divided signal at junction 129. The input 142, and an output line supply input 144, which connects to the output line 140 through resistor R50, can be connected to suitable supplies depending on desired characteristics of the output signal. For example, the input 144 could be tied to the positive side of supply 130. Capacitor 146 provides voltage stability for supply input 42.

Thus, each of the foregoing level shifting circuits functions by taking a ground referenced positive logic level input signal, producing a complement of the input signal, applying the input signal and its complement to comparable voltage divider pairs (referenced to either a negative voltage supply (FIG. 1) or positive voltage supply (FIG. 2)) to set up a differential input signal that is applied to a comparator that produces a shifted output signal. The use of actively driven, differential signals rather than a passive pullup/pulldown, single-ended signal, and the use of a comparator to extract the differential signal from the common mode component can enable this circuit to offer high speed, low cost, low component count and wide voltage supply (30 or 130) operating range. Further, the use of differential signals can provide noise cancellation.

Figure 3:
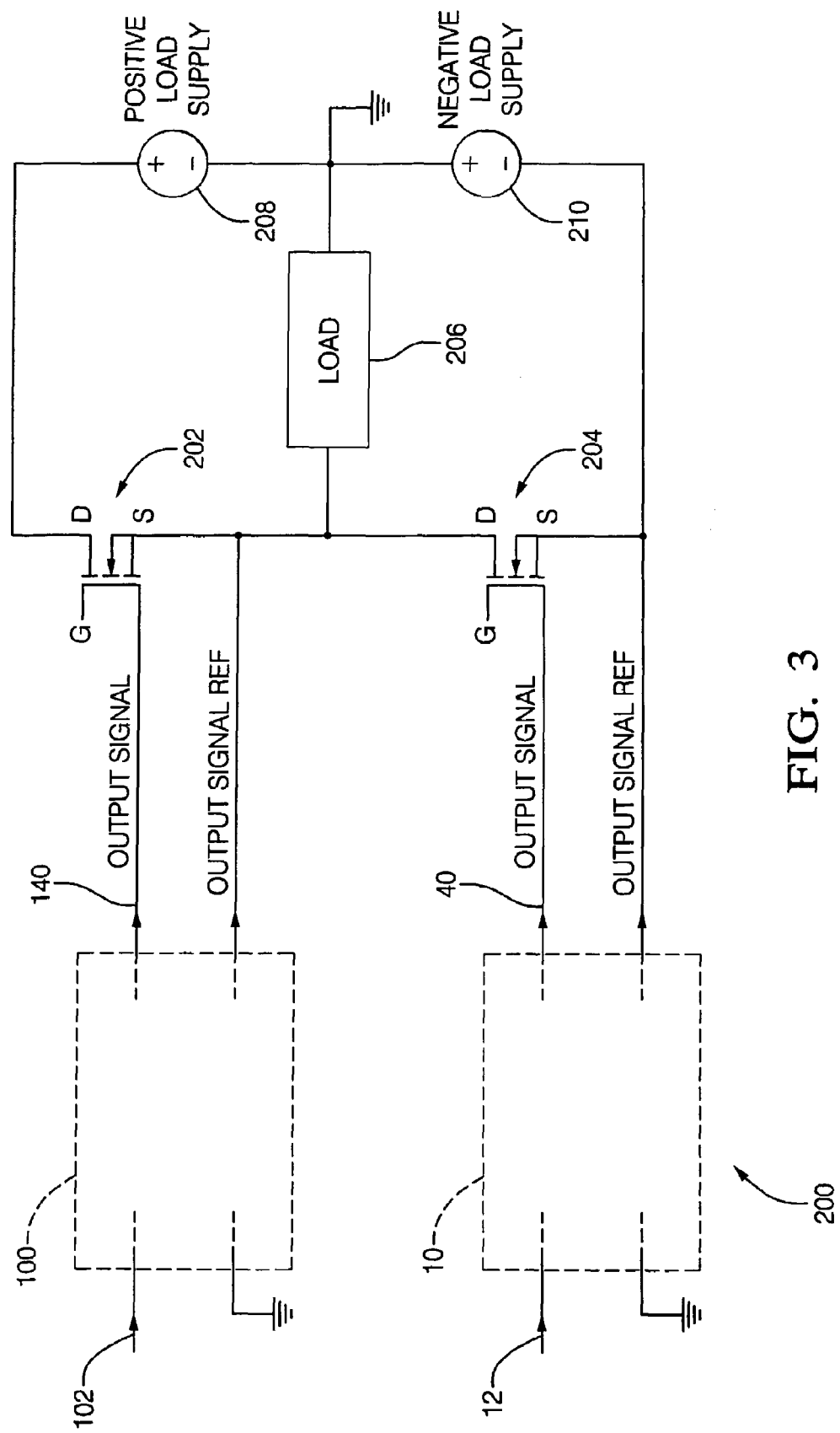
FIG. 3 is a schematic of a circuit implementation using the circuits of FIGS. 1 and 2.

Referring now to FIG. 3, a circuit 200 depicts an exemplary use of the circuits 100 and 10 of FIGS. 1 and 2 to control respective N-channel MOSFETS 202 and 204 in order to selectively deliver power to a load 206 from either a positive load supply 208 or a negative load supply 210. Circuit 100 shifts a ground referenced logic signal applied at input 102 to an OUTPUT SIGNAL at 140 that is used to control the ON/OFF state of MOSFET 202. The supply 130 (not shown in FIG. 3) of circuit 100 maintains a sufficiently high gate to source voltage on MOSFET 202 via the OUTPUT SIGNAL REF line connected to the source of MOSFET 202 so as to provide proper control of the MOSFET 202. Referring to FIGS. 2 and 3 in combination, where the comparator 138 is open collector and the input 144 is connected to supply 130 (which is larger than the load supply 208), when the logic input 102 is set high, the comparator output is pulled high to supply 130 through resistor R50 causing the MOSFET to turn ON. With the MOSFET 202 turned ON the gate to source voltage is the magnitude of the voltage of supply 130 less the magnitude of the voltage of load supply 208, maintaining the MOSFET 202 in the ON state. When the logic input 102 to circuit 100 is set low, the comparator output 140 is connected to OUTPUT SIGNAL REF, effectively setting the gate to source voltages of the MOSFET 202 to zero, causing the MOSFET 202 to shut OFF.

Circuit 10 shifts a ground referenced logic signal applied at input 12 to an OUTPUT SIGNAL at 40 that is used to control the ON/OFF state of MOSFET 204. The negative supply 30 (not shown in FIG. 3) can effectively be replaced by the negative load supply 210, as including both would merely be a connection of two supplies in parallel. When the logic input 12 is set high, the comparator output is pulled "high" through resistor R5 to whatever voltage is applied at input 44 causing the MOSFET to turn ON, because the voltage provided at input 44 is selected higher than negative supply 210. When the logic input 12 to circuit 10 is set low, the comparator output is connected to OUTPUT SIGNAL REF, effectively setting the gate to source voltages of the MOSFET 204 to zero, causing the MOSFET 204 to shut OFF.

The foregoing description has been presented for purposes of illustration. It is not intended to be exhaustive or to limit the scope of this application to the precise steps or forms disclosed, and obviously many modifications and variations are possible in light of the above teaching. It is intended that the scope of coverage should correspond to the claims now or hereafter appended hereto.

The invention claimed is:

1. A level shift circuit for shifting a ground referenced positive logic level signal to an output signal referenced to a negative supply, the circuit comprising:
   an input for receiving the ground referenced positive logic level signal;
   an inverting circuit portion connected to receive the ground referenced positive logic level signal and to produce a complement logic signal therefrom;
   voltage divider circuitry to which both the ground referenced positive logic level signal and the complement signal are applied to produce a differential signal in the form of a first voltage divided signal corresponding to the ground referenced positive logic level signal and a second voltage divided signal corresponding to the complement logic signal, the voltage divider circuitry referenced to a negative voltage supply; and
   comparator circuitry to which the differential input signal is applied, the comparator circuitry producing the output signal which is referenced to the negative voltage supply, the output signal set to a higher voltage or a lower voltage according to a difference between the first voltage divided signal and the second voltage divided signal.

2. The level shift circuit of claim 1 wherein the voltage divider circuitry includes a first voltage divider to which the ground referenced positive logic level input signal is applied, a second voltage divider to which the complement logic signal is applied, the second voltage divider having a voltage division ratio that is the same as a voltage division ratio of the first voltage divider, both the first voltage divider and the second voltage divider referenced to the negative voltage supply.

3. The bipolar level shift circuit of claim 2 wherein first capacitor is connected across a first resistor of the first voltage divider and a second capacitor is connected across a first resistor of the second voltage divider.

4. The bipolar level shift circuit of claim 1 wherein:
the comparator circuitry includes a comparator with a power supply input;
an output supply input is associated through a resistor with an output line of the comparator;
wherein an input to the power supply input and the output supply input can be selected to establish desired output signal characteristics.

5. A method of shifting a ground referenced positive logic level signal to an output signal referenced to a negative supply, the method comprising the steps of:
(a) producing a complement logic signal of the ground referenced positive logic signal;
(b) applying the ground referenced positive logic signal to a first voltage divider to produce a first voltage divided signal;
(c) applying the complement logic signal to a second voltage divider to produce a second voltage divided signal, wherein the first voltage divider and the second voltage divider include the same voltage division ratio, both the first voltage divider and the second voltage divider referenced to a negative supply;
(d) applying the first voltage divided signal and the second voltage divided signal as differential inputs to a comparator to produce the output signal that is referenced to a negative supply.

6. A level shift circuit for shifting a ground referenced positive logic level signal to an output signal referenced to a higher voltage positive supply, the circuit comprising:
an input for receiving the ground referenced logic level input signal;
an inverting circuit portion connected to receive the ground referenced logic level input signal and to produce a complement logic signal therefrom;
voltage divider circuitry to which both the ground referenced positive logic level signal and the complement signal are applied to produce a differential signal in the form of a first voltage divided signal corresponding to the ground referenced positive logic level signal and a second voltage divided signal corresponding to the complement signal, the voltage divider circuitry referenced to a positive voltage supply; and
comparator circuitry to which the differential input signal is applied, the comparator circuitry producing the output signal which is referenced to a positive interface voltage supply, the output signal set to a higher voltage or a lower voltage according to a difference between the first voltage divided signal and the second voltage divided signal.

7. The level shift circuit of claim 6 wherein the voltage divider circuitry includes a first voltage divider to which the ground referenced positive logic level input signal is applied, a second voltage divider to which the complement logic signal is applied, the second voltage divider having a voltage division ratio that is the same as a voltage division ratio of the first voltage divider, both the first voltage divider and the second voltage divider referenced to the positive voltage supply.

8. The bipolar level shift circuit of claim 7 wherein first capacitor is connected across a first resistor of the first voltage divider and a second capacitor is connected across a first resistor of the second voltage divider.

9. The bipolar level shift circuit of claim 6 wherein:
the comparator circuitry includes a comparator with a power supply input connected to the positive voltage supply;
an output supply input is associated through a resistor with an output line of the comparator;
wherein an input to the output supply input can be selected to establish desired output signal characteristics.

10. A method of shifting a ground referenced positive logic level signal to an output signal referenced to a higher positive supply, the method comprising the steps of:
(a) producing a complement logic signal of the ground referenced positive logic signal;
(b) applying the ground referenced positive logic signal to a first voltage divider to produce a first voltage divided signal;
(c) applying the complement logic signal to a second voltage divider to produce a second voltage divided signal, wherein the first voltage divider and the second voltage divider include the same voltage division ratio, both the first voltage divider and the second voltage divider referenced to a positive supply;
(d) applying the first voltage divided signal and the second voltage divided signal as differential inputs to a comparator to produce the output signal that is referenced to the higher positive supply.

11. A method of level shifting a ground referenced positive logic level signal, the method comprising the steps of:
(a) producing a complement logic signal of the ground referenced positive logic signal;
(b) applying the ground referenced positive logic signal to a first voltage divider to produce a first voltage divided signal;
(c) applying the complement logic signal to a second voltage divider to produce a second voltage divided signal, wherein the first voltage divider and the second voltage divider include the same voltage division ratio, both the first voltage divider and the second voltage divider referenced to the same supply;
(d) applying the first voltage divided signal and the second voltage divided signal as differential inputs to a comparator to produce the output signal.

12. The method of claim 11 wherein the same supply comprises a negative supply.

13. The method of claim 12 wherein the output signal is referenced to the negative supply.

14. The method of claim 11 wherein the same supply comprises a positive supply.

* * * * *